United States Patent
Liu et al.

(10) Patent No.: US 11,656,259 B1
(45) Date of Patent: May 23, 2023

(54) SYSTEM AND METHOD OF MEASURING THE FREQUENCY OF A RADIO FREQUENCY SIGNAL

(71) Applicant: North University of China, Taiyuan (CN)

(72) Inventors: Jun Liu, Taiyuan (CN); Zongmin Ma, Taiyuan (CN); Jun Tang, Taiyuan (CN); Yunbo Shi, Taiyuan (CN); Hao Guo, Taiyuan (CN); Zhonghao Li, Taiyuan (CN); Xiaocheng Wang, Taiyuan (CN); Junzhi Zhao, Taiyuan (CN); Doudou Zheng, Taiyuan (CN); Qimeng Wang, Taiyuan (CN)

(73) Assignee: North University of China, Taiyuan (CN)

( * ) Notice: Subject to any disclaimer, the term of this patent is extended or adjusted under 35 U.S.C. 154(b) by 0 days.

(21) Appl. No.: 17/693,793

(22) Filed: Mar. 14, 2022

(30) Foreign Application Priority Data

Nov. 19, 2021 (CN) .......................... 202111400219.7

(51) Int. Cl.
*G01R 29/08* (2006.01)
(52) U.S. Cl.
CPC ..... *G01R 29/0885* (2013.01); *G01R 29/0871* (2013.01)
(58) Field of Classification Search
CPC .......................... G01R 29/0885; G01R 29/0871
See application file for complete search history.

(56) References Cited

U.S. PATENT DOCUMENTS

| | | | | |
|---|---|---|---|---|
| 2008/0265902 A1* | 10/2008 | Kiminami | .......... | G01R 29/0857 702/57 |
| 2016/0216340 A1* | 7/2016 | Egan | ...................... | G01N 21/63 |
| 2016/0363621 A1* | 12/2016 | Kalokitis | ........... | G01R 29/0885 |
| 2017/0343695 A1* | 11/2017 | Stetson | ................ | G01R 33/032 |
| 2019/0146045 A1* | 5/2019 | Niu | ...................... | G01Q 30/025 324/304 |

* cited by examiner

*Primary Examiner* — Alvaro E Fortich
(74) *Attorney, Agent, or Firm* — Bauer Law Offices; Robert M. Bauer

(57) ABSTRACT

A frequency measurement system and method of a radio frequency (RF) signal. The frequency measurement system includes: a magnetic field source module, a light source module, an excitation module, a complementary metal-oxide-semiconductor (CMOS) camera, and a signal processing module; the excitation module is disposed in the magnetic field; the excitation module is disposed on an output light path of the light source module; the CMOS camera is disposed on an output light path of the excitation module; and the CMOS camera is connected to the signal processing module; the light source module is configured to emit a laser; the CMOS camera is configured to capture an excitation image when the laser enters the excitation module to which a to-be-tested RF signal is applied; and the signal processing module is configured to determine a frequency of the to-be-tested RF signal according to the excitation image.

20 Claims, 4 Drawing Sheets

SYSTEM AND METHOD OF MEASURING THE FREQUENCY OF A RADIO FREQUENCY SIGNAL

CROSS REFERENCE TO RELATED APPLICATION(S)

This patent application claims the benefit and priority of Chinese Patent Application No. 202111400219.7, filed on Nov. 19, 2021, the disclosure of which is incorporated by reference herein in its entirety as part of the present application.

TECHNICAL FIELD

The present disclosure relates to the field of signal frequency measurement technologies, and in particular to a frequency measurement system and method of a radio frequency (RF) signal.

BACKGROUND ART

In modern production and life, RF signal measurement has become a necessary means to research, develop, product, inspect, and measure electronic products. In the traditional electronic measurement of frequency signals, in order to ensure the accuracy of the measurement and the performance of the measurement system, electronic components used have lots of limitations and requirements. For example, the electronic components are expensive, have an excessively large size, and are susceptible to strong electromagnetic interference. In special environments under extreme environmental conditions of high temperature, high pressure and the like, the electronic components cannot meet the increasingly stringent frequency measurement requirements. Therefore, it is urgently necessary to provide a frequency measurement system that, with a strong anti-interference ability and low maintenance costs, can instantaneously detect and operate in extreme environments.

SUMMARY

An objective of the present disclosure is to provide a frequency measurement system and method of a RF signal, with the advantages of a strong anti-interference ability, large measurement bandwidth, and high measurement accuracy.

To implement the above objective, the present disclosure provides the following solutions:

A frequency measurement system of a RF includes:
a magnetic field source module, a light source module, an excitation module, a complementary metal-oxide-semiconductor (CMOS) camera, and a signal processing module, where the magnetic field source module is configured to generate a magnetic field;
the excitation module is disposed in the magnetic field;
the excitation module is disposed on an output light path of the light source module; the CMOS camera is disposed on an output light path of the excitation module; and the CMOS camera is connected to the signal processing module;
the light source module is configured to emit a laser;
the CMOS camera is configured to capture an excitation image when the laser enters the excitation module to which a to-be-tested RF signal is applied; and the signal processing module is configured to determine a frequency of the to-be-tested RF signal according to the excitation image.

Optionally, the light source module specifically includes:
a laser source, a half-wave plate, a polarizing beam splitter, a first convex lens, an acousto-optic modulator, a second convex lens, a mirror, and an optical beam reducer that are disposed sequentially; and
the excitation module is disposed on an output light path of the optical beam reducer.

Optionally, the laser source is 532 mn.

Optionally, the magnetic field source module specifically includes:
a three-axis translation stage and a magnetic field source; and
the magnetic field source is disposed on the three-axis translation stage; and the three-axis translation stage is configured to adjust a position of the magnetic field source.

Optionally, the magnetic field source is a gradient magnetic field source.

Optionally, the excitation module specifically includes:
a power amplifier, a long-strip antenna board, and a diamond;
the diamond is disposed on the long-strip antenna board; and the power amplifier is connected to the long-strip antenna board; and
the power amplifier is configured to receive the to-be-tested RF signal, and after amplifying power of the to-be-tested RF signal, transmit the to-be-tested RF signal to the diamond by using the long-strip antenna board.

Optionally, a filter is disposed between the excitation module and the CMOS camera.

A frequency measurement method of a RF signal is applied to the foregoing frequency measurement system and includes:
obtaining an excitation image when a laser enters an excitation module to which a to-be-tested RF signal is applied, the excitation image being an image including a formant dark spot; and
determining, by a signal processing module, a frequency of the to-be-tested RF signal according to the excitation image.

Optionally, the obtaining an excitation image when a laser enters an excitation module to which a to-be-tested RF signal is applied specifically includes:
capturing, by a CMOS camera, an instantaneous image at the excitation module;
determining whether there is a formant dark spot on the instantaneous image to obtain a determination result;
adjusting an angle of a three-axis translation stage if the determination result is no, and returning to the step of capturing, by a CMOS camera, an instantaneous image at the excitation module; and
determining the instantaneous image as an excitation image if the determination result is yes.

Optionally, the determining, by a signal processing module, a frequency of the to-be-tested RF signal according to the excitation image specifically includes:
determining a first dark spot offset between the formant dark spot and a first edge of a diamond according to the excitation image, the first edge of the diamond being an edge closest to the power amplifier;
determining a distance between the formant dark spot and a magnetic field source as a second dark spot offset according to a distance between the diamond and the magnetic field source as well as the dark spot offset;

determining a magnetic field strength of the formant dark spot according to the second dark spot offset and a relationship between the second dark spot offset and a magnetic field gradient;

obtaining a frequency offset according to the magnetic field strength at the formant dark spot by using a formula $\Delta f=2\gamma B$; and determining the frequency of the to-be-tested RF signal according to the frequency offset and a resonant frequency of a diamond Nitrogen-Vacancy (NV) center in a zero magnetic field by using a formula $f=f_0+\Delta f$, where $\Delta f$ is the frequency offset, $\gamma$ is a gyromagnetic ratio, $\gamma=2.8$ MHz/Gauss, B is the magnetic field strength of the formant dark spot, $f0$ is the frequency of the to-be-tested RF signal, and $f_0$ is the resonant frequency of the diamond NV center in the zero magnetic field.

Based on specific embodiments provided in the present disclosure, the present disclosure discloses the following technical effects:

The present disclosure provides a frequency measurement system and method of a RF signal. The frequency measurement system includes: a magnetic field source module, a light source module, an excitation module, a CMOS camera, and a signal processing module, where the magnetic field source module is configured to generate a magnetic field; the excitation module is disposed in the magnetic field; the excitation module is disposed on an output light path of the light source module; the CMOS camera is disposed on an output light path of the excitation module; and the CMOS camera is connected to the signal processing module; the light source module is configured to emit a laser; the CMOS camera is configured to capture an excitation image when the laser enters the excitation module to which a to-be-tested RF signal is applied; and the signal processing module is configured to determine a frequency of the to-be-tested RF signal according to the excitation image. In the present disclosure, by disposing the magnetic field source module and the excitation module, the frequency measurement system and method have the advantages of a strong anti-interference ability, large measurement bandwidth and high measurement accuracy during the frequency measurement of RFs.

BRIEF DESCRIPTION OF THE DRAWINGS

To describe the embodiments of the present disclosure or the technical solutions in the related art more clearly, the accompanying drawings required in the embodiments are briefly introduced below. Obviously, the accompanying drawings described below are only some embodiments of the present disclosure. Those of ordinary skill in the art may further obtain other accompanying drawings based on these accompanying drawings without creative labor.

FIG. 2 (b) is a schematic diagram of relative positions of the antenna and the diamond according to an embodiment of the present disclosure;

Figure 1:
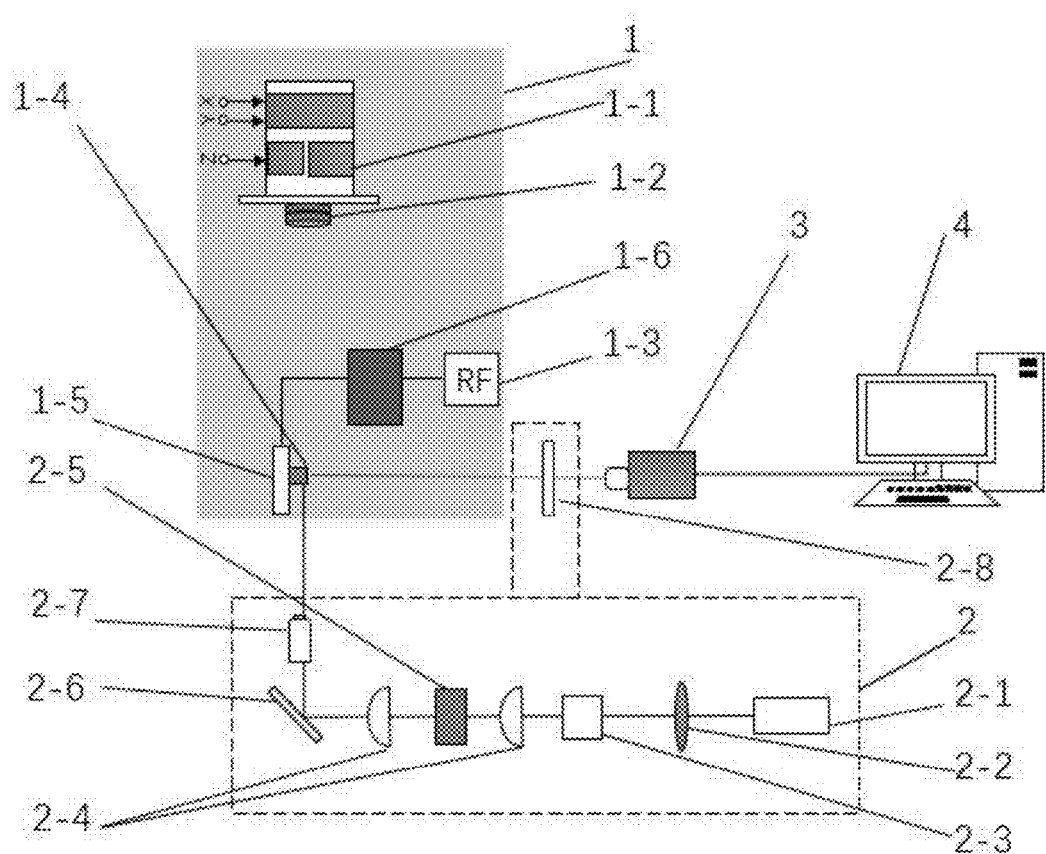
FIG. 1 is a schematic structural diagram of a frequency measurement system of a RF according to an embodiment of the present disclosure.

Description of the accompanying drawings: 1-To-be-tested unit; 1-1-Three-axis translation stage; 1-2-Gradient magnetic field source; 1-2-1-Magnetic field gradient; 1-3-To-be-tested RF signal; 1-4-Special diamond; 1-5-Long-strip antenna board; 1-5-1-Long-strip antenna; 1-6-Power amplifier; 2-Optical path system; 2-1-Laser source; 2-2-Half-wave plate; 2-3-Polarizing beam splitter; 2-4-Convex lens; 2-5-Acousto-optic modulator; 2-6-Mirror; 2-7-Optical beam reducer; 2-8-Filter; 3-CMOS camera; and 4-Data processing unit.

DETAILED DESCRIPTION OF THE EMBODIMENTS

The technical solutions in the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by a person of ordinary skill in the art on the basis of the embodiments of the present disclosure without creative efforts shall fall within the protection scope of the present disclosure.

An objective of the present disclosure is to provide a frequency measurement system and method of a RF signal, with the advantages of a strong anti-interference ability, large measurement bandwidth, and high measurement accuracy.

To make the above objectives, features, and advantages of the present disclosure clearer and more comprehensible, the present disclosure is further described in detail below with reference to the accompanying drawings and the specific examples.

The present disclosure provides the frequency measurement system of a RF, including:

a magnetic field source module, a light source module, an excitation module, a CMOS camera, and a signal processing module, where the magnetic field source module is configured to generate a magnetic field;

the excitation module is disposed in the magnetic field; the excitation module is disposed on an output light path of the light source module; the CMOS camera is disposed on an output light path of the excitation module; and the CMOS camera is connected to the signal processing module;

the light source module is configured to emit a laser;

the CMOS camera is configured to capture an excitation image when the laser enters the excitation module to which a to-be-tested RF signal is applied; and the signal processing module is configured to determine a frequency of the to-be-tested RF signal according to the excitation image.

The light source module specifically includes:

a laser source, a half-wave plate, a polarizing beam splitter, a first convex lens, an acousto-optic modulator, a second convex lens, a mirror, and an optical beam reducer that are disposed sequentially; and the excitation module is disposed on an output light path of the optical beam reducer.

Specifically, the laser source is 532 mn.

Specifically, the magnetic field source module specifically includes:

a three-axis translation stage and a magnetic field source; and the magnetic field source is disposed on the three-axis translation stage; and the three-axis translation stage is configured to adjust a position of the magnetic field source.

The magnetic field source is a gradient magnetic field source.

The excitation module specifically includes:

a power amplifier, a long-strip antenna board, and a diamond;

the diamond is disposed on the long-strip antenna board; and the power amplifier is connected to the long-strip antenna board; and the power amplifier is configured to receive the to-be-tested RF signal, and after amplifying power of the to-be-tested RF signal, transmit the to-be-tested RF signal to the diamond by using the long-strip antenna board.

In addition, in the frequency measurement system of a RF signal provided in the present disclosure, a filter is disposed between the excitation module and the CMOS camera.

As shown in FIG. 1, the present disclosure provides a NV center in diamond instantaneous-frequency detection system based on a gradient magnetic field. The system includes: a to-be-tested unit 1, an optical path system 2, a CMOS camera 3, and a data processing unit 4.

Figure 2:
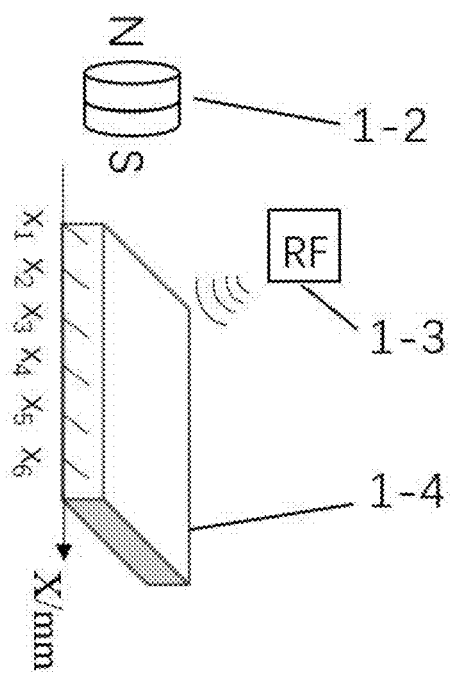
FIG. 2 (a) is schematic diagram of relative positions of the gradient magnetic field source and the antenna according to an embodiment of the present disclosure.
Figure 2:
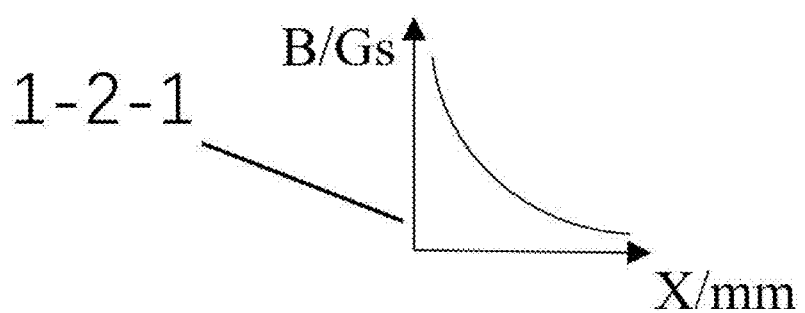
Figure 3:
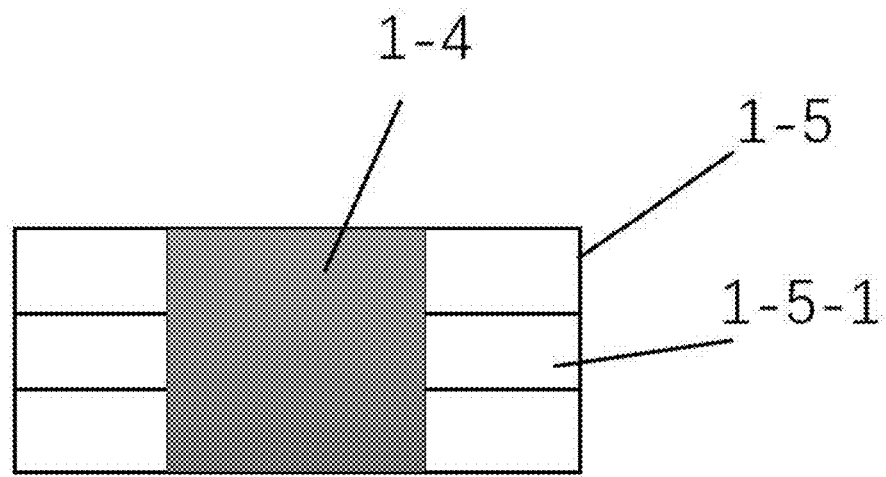
FIG. 3 is a schematic diagram of a magnetic field gradient according to an embodiment of the present disclosure.

With reference to FIG. 2(*a*), 2(*b*), and FIG. 3, a schematic diagram in which the gradient magnetic field source and an antenna act on the diamond includes a three-axis translation stage 1-1, a gradient magnetic field source 1-2, a magnetic field gradient 1-2-1, a to-be-tested RF signal 1-3, a special diamond 1-4, a long-strip antenna board 1-5, a long-strip antenna 1-5-1, and a power amplifier 1-6. When the to-be-tested RF signal 1-3 acts on the special diamond 1-4 by using the long-strip antenna board 1-5, the magnetic field gradient 1-2-1 shows a downward trend along the laser direction. The to-be-tested RF signal 1-3 acts on the special diamond along the long-strip antenna 1-5-1. The three-axis translation stage 1-1 is moved to change the downward trend of the magnetic field gradient in the diamond until a formant of the signal is detected, and the formant is shot instantaneously by the CMOS camera 3. The special diamond of a high-concentration NV center is prepared through the nitrogen ion implantation and the multi-stage annealing process. The length×width×height of its size is 10 mm×10 mm×5 mm.

Figure 4:
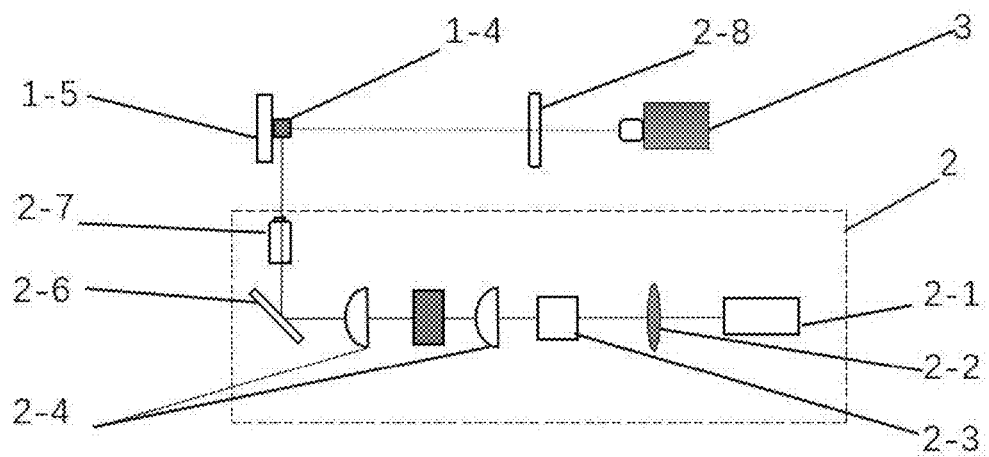
FIG. 4 is a schematic structural diagram of an optical path of a NV center quantum system according to an embodiment of the present disclosure.

With reference to FIG. 4, the optical path structure of NV center quantum system includes a laser source 2-1, a half-wave plate 2-2, a polarizing beam splitter 2-3, a convex lens 2-4, an acousto-optic modulator 2-5, a mirror 2-6, an optical beam reducer 2-7, and a filter 2-8. The 532-nm laser generated by the laser source 2-1 runs through the half-wave plate 2-2 and the polarizing beam splitter 2-3 to obtain a vertically polarized laser of which the intensity can be adjusted arbitrarily, which is conducive to polarizing the NV center more efficiently. The light path is focused and aligned through the convex lens 2-4. A diffraction effect is generated through the acousto-optic modulator 2-5. A first-order diffracted light is filtered out by using a diaphragm to provide a pulsed beam for the quantum state control of the NV center. The mirror 2-6 directs the laser into the optical beam reducer 2-7 for focusing, and the laser is finally directed into the special diamond 1-4.

When the to-be-tested RF signal acts on the special diamond by using the power amplifier and the long-strip antenna board, the gradient magnetic field source generates a gradient magnetic field in the special diamond along the direction of the antenna. The three-axis translation stage is moved to change the magnetic field gradient in the diamond. In the optical path system, the 532-nm laser generated by the laser source runs through the half-wave plate and the polarizing beam splitter to obtain the vertically polarized laser of which the intensity can be adjusted arbitrarily, which is conducive to polarizing the NV center more efficiently. The light path is focused and aligned through the convex lens. The diffraction effect is generated through the acousto-optic modulator. The first-order diffracted light is filtered out by using a diaphragm to provide the pulsed beam for the quantum state control of the NV center. The mirror directs the laser into the optical beam reducer for reducing, and the laser is finally directed into the special diamond. The gradient magnetic field source generates the gradient magnetic field in the special diamond along the direction of the antenna. The CMOS camera instantaneously shoots a fluorescent signal generated in the special diamond. If a dark spot generated by a formant is not shot, the three-axis translation stage may be moved to change the magnetic field gradient, and the special diamond is shot instantaneously again until a dark spot generated by the formant is shot. The corresponding magnetic field strength can be obtained according to a distance between the gradient magnetic field source and the special diamond, and is processed and calculated by the data processing unit. The resonant frequency offset is inversely deduced from the Zeeman splitting degree of the formant, and the frequency of the to-be-tested signal is obtained from the resonant frequency offset.

Specifically, the CMOS camera instantaneously shoots the fluorescent signal generated in the special diamond. If the dark spot generated by the formant is not shot, the three-axis translation stage may be moved to change the magnetic field gradient, and the special diamond is shot instantaneously again until a dark spot generated by the formant is shot. The corresponding magnetic field strength can be obtained according to the distance between the gradient magnetic field source and the special diamond, and is processed and calculated by the data processing unit. The calculation process is as follows: An offset $\Delta x1$ between a formant dark part and an edge of the diamond block is obtained first according to a result of the instantaneous shooting. The offset is added to a displacement $\Delta x2$ of the diamond to a magnet to obtain a total distance $\Delta x$ between the formant dark spot and the magnet. An actual magnetic field size B at the formant dark spot is obtained according to the magnetic field gradient and a displacement $\Delta x$. The energy-step transition frequency of the NV center changes with the magnetic field size in the axial magnetic field, that is, $\Delta f = 2\gamma B$ ($\gamma$ is a gyromagnetic ratio of 2.8 MHz/Gauss). A frequency $f = f_0 + \Delta f$ of an unknown RF signal is obtained according to the frequency offset $\Delta f$ obtained through measurement and the resonant frequency 2.87 GHz ($f_0$) of the NV center in the zero magnetic field. Due to the limited length of the diamond along the direction of the magnetic field gradient, to make full use of the entire magnetic field gradient as much as possible and increase the frequency measurement range, the magnetic field gradient is uniformly divided into a plurality of small magnetic field gradient intervals along the x-axis direction by the length of the diamond. The diamond position offset of the corresponding interval and the corresponding small magnetic field gradient are recorded and stored, which is convenient for directly finding the displacement of the diamond to the magnetic field during the subsequent data processing, thereby obtaining the magnetic field gradient in the corresponding interval.

Then, the magnetic field information at the formant dark spot can be calculated faster finally according to the position of the formant dark spot on the diamond. The magnetic field gradients of the gradient magnetic field source are used as a database to be uploaded to the data processing unit. When the formant of the signal is shot, the offset of the formant can be quickly located in the computer.

Figure 5:
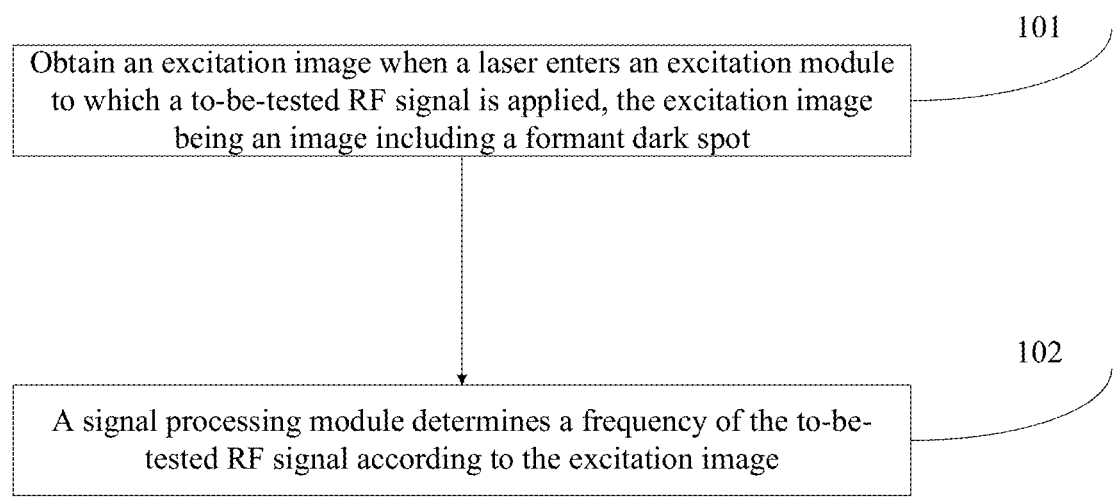
FIG. 5 is a flowchart of a frequency measurement method of a RF according to an embodiment of the present disclosure.

As shown in FIG. 5, the present disclosure further provides a frequency measurement method of a RF, applied to the foregoing frequency measurement system, and including:

step 101: Obtain an excitation image when a laser enters an excitation module to which a to-be-tested RF signal is applied, the excitation image being an image including a formant dark spot; and step 102: A signal processing module determines a frequency of the to-be-tested RF signal according to the excitation image.

Step 101 specifically includes:

capturing, by a CMOS camera, an instantaneous image at the excitation module;

determining whether there is a formant dark spot on the instantaneous image to obtain a determination result;

adjusting an angle of a three-axis translation stage if the determination result is no, and returning to the step of capturing, by a CMOS camera, an instantaneous image at the excitation module; and determining the instantaneous image as an excitation image if the determination result is yes.

Step 102 specifically includes:

determining a first dark spot offset between the formant dark spot and a first edge of a diamond according to the excitation image, the first edge of the diamond being an edge closest to the power amplifier;

determining a distance between the formant dark spot and a magnetic field source as a second dark spot offset according to a distance between the diamond and the magnetic field source as well as the dark spot offset;

determining a magnetic field strength of the formant dark spot according to the second dark spot offset and a relationship between the second dark spot offset and a magnetic field gradient;

obtaining a frequency offset according to the magnetic field strength at the formant dark spot by using a formula $\Delta f = 2\gamma B$; and determining the frequency of the to-be-tested RF signal according to the frequency offset and a resonant frequency of a diamond Nitrogen-Vacancy (NV) center in a zero magnetic field by using a formula $f = f_0 \Delta f$, where $\Delta f$ is the frequency offset, $\gamma$ is a gyromagnetic ratio, $\gamma = 2.8$ MHz/Gauss, B is the magnetic field strength of the formant dark spot, $f$ is the frequency of the to-be-tested RF signal, and $f_0$ is the resonant frequency of the diamond NV center in the zero magnetic field.

The various embodiments in this specification are described in a progressive manner. Each embodiment focuses on the differences from other embodiments. The same or similar parts between the various embodiments can be referred to each other. The system disclosed in the embodiments corresponds to the method disclosed in the embodiments. Therefore, the system is described in a relatively simple manner. For the related parts, reference may be made to the description of the method parts.

Several examples are used for illustration of the principles and implementations of the present disclosure. The description of the embodiments is merely used to help illustrate the method and its core concept in the present disclosure. In addition, those of ordinary skill in the art can make various modifications in terms of the specific implementations and the application scope in accordance with the concept of the present disclosure. In conclusion, the content of this specification shall not be construed as a limitation to the present disclosure.

What is claimed is:

1. A frequency measurement system of a radio frequency (RF) signal, comprising:
    a magnetic field source module, a light source module, an excitation module, a complementary metal-oxide-semiconductor (CMOS) camera, and a signal processing module, wherein
    the magnetic field source module is configured to generate a magnetic field;
    the excitation module is disposed in the magnetic field; the excitation module is disposed on an output light path of the light source module; the CMOS camera is disposed on an output light path of the excitation module; and the CMOS camera is connected to the signal processing module;
    the light source module is configured to emit a laser;
    the CMOS camera is configured to capture an excitation image when the laser enters the excitation module to which a to-be-tested RF signal is applied; and
    the signal processing module is configured to determine a frequency of the to-be-tested RF signal according to the excitation image.

2. The frequency measurement system of a RF signal according to claim 1, wherein the light source module specifically comprises:
    a laser source, a half-wave plate, a polarizing beam splitter, a first convex lens, an acousto-optic modulator, a second convex lens, a mirror, and an optical beam reducer that are disposed sequentially; and
    the excitation module is disposed on an output light path of the optical beam reducer.

3. The frequency measurement system of a RF signal according to claim 2, wherein the laser source is 532 nm (nanometer).

4. The frequency measurement system of a RF signal according to claim 2, wherein the magnetic field source module specifically comprises:
    a three-axis translation stage and a magnetic field source; and
    the magnetic field source is disposed on the three-axis translation stage; and the three-axis translation stage is configured to adjust a position of the magnetic field source.

5. The frequency measurement system of a RF signal according to claim 4, wherein the magnetic field source is a gradient magnetic field source.

6. The frequency measurement system of a RF signal according to claim 5, wherein the excitation module specifically comprises:
    a power amplifier, a long-strip antenna board, and a diamond;
    the diamond is disposed on the long-strip antenna board; and the power amplifier is connected to the long-strip antenna board; and
    the power amplifier is configured to receive the to-be-tested RF signal, and after amplifying power of the to-be-tested RF signal, transmit the to-be-tested RF signal to the diamond by using the long-strip antenna board.

7. The frequency measurement system of a RF signal according to claim 1, wherein a filter is disposed between the excitation module and the CMOS camera.

8. A frequency measurement method of a RF signal, applied to the frequency measurement system according to claim 1, and comprising:
   obtaining an excitation image when a laser enters an excitation module to which a to-be-tested RF signal is applied, the excitation image being an image comprising a formant dark spot; and
   determining, by a signal processing module, a frequency of the to-be-tested RF signal according to the excitation image.

9. The frequency measurement method of a RF signal according to claim 8, wherein the light source module specifically comprises:
   a laser source, a half-wave plate, a polarizing beam splitter, a first convex lens, an acousto-optic modulator, a second convex lens, a mirror, and an optical beam reducer that are disposed sequentially; and
   the excitation module is disposed on an output light path of the optical beam reducer.

10. The frequency measurement method of a RF signal according to claim 9, wherein the laser source is 532 nm (nanometer).

11. The frequency measurement method of a RF signal according to claim 9, wherein the magnetic field source module specifically comprises:
   a three-axis translation stage and a magnetic field source; and
   the magnetic field source is disposed on the three-axis translation stage; and the three-axis translation stage is configured to adjust a position of the magnetic field source.

12. The frequency measurement method of a RF signal according to claim 11, wherein the magnetic field source is a gradient magnetic field source.

13. The frequency measurement method of a RF signal according to claim 12, wherein the excitation module specifically comprises:
   a power amplifier, a long-strip antenna board, and a diamond;
   the diamond is disposed on the long-strip antenna board; and the power amplifier is connected to the long-strip antenna board; and
   the power amplifier is configured to receive the to-be-tested RF signal, and after amplifying power of the to-be-tested RF signal, transmit the to-be-tested RF signal to the diamond by using the long-strip antenna board.

14. The frequency measurement method of a RF signal according to claim 8, wherein a filter is disposed between the excitation module and the CMOS camera.

15. The frequency measurement method of a RF signal according to claim 8, wherein the obtaining an excitation image when a laser enters an excitation module to which a to-be-tested RF signal is applied specifically comprises:
   capturing, by a CMOS camera, an instantaneous image at the excitation module;
   determining whether there is a formant dark spot on the instantaneous image to obtain a determination result;
   adjusting an angle of a three-axis translation stage if the determination result is no, and returning to the step of capturing, by a CMOS camera, an instantaneous image at the excitation module; and
   determining the instantaneous image as an excitation image if the determination result is yes.

16. The frequency measurement method of a RF signal according to claim 9, wherein the obtaining an excitation image when a laser enters an excitation module to which a to-be-tested RF signal is applied specifically comprises:
   capturing, by a CMOS camera, an instantaneous image at the excitation module;
   determining whether there is a formant dark spot on the instantaneous image to obtain a determination result;
   adjusting an angle of a three-axis translation stage if the determination result is no, and returning to the step of capturing, by a CMOS camera, an instantaneous image at the excitation module; and
   determining the instantaneous image as an excitation image if the determination result is yes.

17. The frequency measurement method of a RF signal according to claim 10, wherein the obtaining an excitation image when a laser enters an excitation module to which a to-be-tested RF signal is applied specifically comprises:
   capturing, by a CMOS camera, an instantaneous image at the excitation module;
   determining whether there is a formant dark spot on the instantaneous image to obtain a determination result;
   adjusting an angle of a three-axis translation stage if the determination result is no, and returning to the step of capturing, by a CMOS camera, an instantaneous image at the excitation module; and
   determining the instantaneous image as an excitation image if the determination result is yes.

18. The frequency measurement method of a RF signal according to claim 11, wherein the obtaining an excitation image when a laser enters an excitation module to which a to-be-tested RF signal is applied specifically comprises:
   capturing, by a CMOS camera, an instantaneous image at the excitation module;
   determining whether there is a formant dark spot on the instantaneous image to obtain a determination result;
   adjusting an angle of a three-axis translation stage if the determination result is no, and returning to the step of capturing, by a CMOS camera, an instantaneous image at the excitation module; and
   determining the instantaneous image as an excitation image if the determination result is yes.

19. The frequency measurement method of a RF signal according to claim 12, wherein the obtaining an excitation image when a laser enters an excitation module to which a to-be-tested RF signal is applied specifically comprises:
   capturing, by a CMOS camera, an instantaneous image at the excitation module;
   determining whether there is a formant dark spot on the instantaneous image to obtain a determination result;
   adjusting an angle of a three-axis translation stage if the determination result is no, and returning to the step of capturing, by a CMOS camera, an instantaneous image at the excitation module; and
   determining the instantaneous image as an excitation image if the determination result is yes.

20. The frequency measurement method of a RF signal according to claim 8, wherein the determining, by a signal processing module, a frequency of the to-be-tested RF signal according to the excitation image specifically comprises:
   determining a first dark spot offset between the formant dark spot and a first edge of a diamond according to the excitation image, the first edge of the diamond being an edge closest to the power amplifier;
   determining a distance between the formant dark spot and a magnetic field source as a second dark spot offset according to a distance between the diamond and the magnetic field source as well as the dark spot offset;

determining a magnetic field strength of the formant dark spot according to the second dark spot offset and a relationship between the second dark spot offset and a magnetic field gradient;

obtaining a frequency offset according to the magnetic field strength at the formant dark spot by using a formula $\Delta f=2\gamma B$; and determining the frequency of the to-be-tested RF signal according to the frequency offset and a resonant frequency of a diamond Nitrogen-Vacancy (NV) center in a zero magnetic field by using a formula $f=f_0+\Delta f$, wherein $\Delta f$ is the frequency offset, $\gamma$ is a gyromagnetic ratio, $\gamma=2.8$ MHz/Gauss, B is the magnetic field strength of the formant dark spot, $f$ is the frequency of the to-be-tested RF signal, and $f_0$ is the resonant frequency of the diamond NV center in the zero magnetic field.

* * * * *